United States Patent
Yu

(10) Patent No.: US 12,007,433 B2
(45) Date of Patent: Jun. 11, 2024

(54) MECHANICAL ARM AND MECHANICAL ARM ASSEMBLY, TEST SYSTEM AND METHOD, STORAGE MEDIUM AND ELECTRONIC DEVICE

(71) Applicant: CHANGXIN MEMORY TECHNOLOGIES, INC., Hefei (CN)

(72) Inventor: Yu Yu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 251 days.

(21) Appl. No.: 17/651,887

(22) Filed: Feb. 21, 2022

(65) Prior Publication Data
US 2022/0236321 A1 Jul. 28, 2022

Related U.S. Application Data

(63) Continuation of application No. PCT/CN2021/110981, filed on Aug. 5, 2021.

(30) Foreign Application Priority Data

Jan. 26, 2021 (CN) .......................... 202110103853.8

(51) Int. Cl.
*G01R 31/28* (2006.01)
*B25J 15/00* (2006.01)

(52) U.S. Cl.
CPC ...... *G01R 31/2867* (2013.01); *B25J 15/0057* (2013.01)

(58) Field of Classification Search
CPC ............ G01R 31/2893; G01R 31/2867; G01R 31/2863; G01R 31/2887; G01R 1/0408;
(Continued)

(56) References Cited

U.S. PATENT DOCUMENTS 4,782,291 A * 11/1988 Blandin ............. G01R 31/2868
324/750.08
6,104,204 A * 8/2000 Hayama ............... G01R 1/0458
324/750.28
(Continued)

FOREIGN PATENT DOCUMENTS

CN 101992189 A 3/2011
CN 203863675 * 10/2014
(Continued)

OTHER PUBLICATIONS

First Office Action of the Chinese application No. 202110103853.8, issued on May 7, 2022.

*Primary Examiner* — Vinh P Nguyen
(74) *Attorney, Agent, or Firm* — Syncoda LLC; Feng Ma

(57) ABSTRACT

A mechanical arm includes a body and an operating arm. The operating arm includes a connector connected to the body, as well as a first adapting part and a second adapting part which are connected to the connector. The first adapting part is configured to mount a first operating mechanism for opening and closing the socket. The second adapting part is configured to mount a second operating mechanism for grabbing and releasing a semiconductor device. After the first adapting part drives the first operating mechanism to open the socket, the second adapting part is able to drive the second operating mechanism to put the semiconductor device into the socket or take the semiconductor device out from the socket.

17 Claims, 7 Drawing Sheets

(58) Field of Classification Search
CPC .............. G01R 1/0483; G01R 31/2886; G01R 31/2891; G01R 31/01; G01R 31/2806; G01R 31/2851; G01R 31/2868; G01R 31/2849; G01R 1/045; G01R 31/2865; G01R 31/2896; G01R 1/04; G01R 31/2808; G01R 35/00; G01R 1/06794; G01R 31/26; G01R 31/2642; G01R 31/2862; B65G 47/905; B65G 47/24; B65G 47/911; B65G 47/918

See application file for complete search history.

(56) References Cited

U.S. PATENT DOCUMENTS

| | | | | |
|---|---|---|---|---|
| 7,251,354 | B2* | 7/2007 | Kanno | G01R 31/01 |
| | | | | 382/145 |
| 7,618,277 | B2* | 11/2009 | Sato | G01R 31/2893 |
| | | | | 439/264 |
| 8,011,092 | B2* | 9/2011 | Cram | G01R 31/2891 |
| | | | | 29/874 |
| 8,941,729 | B2* | 1/2015 | Kikuchi | G01R 31/2893 |
| | | | | 348/126 |
| 9,183,875 | B2* | 11/2015 | Ries | G06F 3/0632 |
| 9,519,024 | B2* | 12/2016 | Chen | G01R 31/2867 |

FOREIGN PATENT DOCUMENTS

| | | |
|---|---|---|
| CN | 203863675 U | 10/2014 |
| CN | 208033076 U | 11/2018 |
| CN | 209167331 U | 7/2019 |
| CN | 110508511 A | 11/2019 |
| CN | 110921317 A | 3/2020 |
| CN | 210704803 U | 6/2020 |
| CN | 111554595 A | 8/2020 |
| CN | 111830401 A | 10/2020 |
| CN | 112958467 A | 6/2021 |
| DE | 102017005170 A1 | 11/2017 |
| JP | 3905659 B2 | 4/2007 |

* cited by examiner

MECHANICAL ARM AND MECHANICAL ARM ASSEMBLY, TEST SYSTEM AND METHOD, STORAGE MEDIUM AND ELECTRONIC DEVICE

CROSS-REFERENCE TO RELATED APPLICATIONS

This is a continuation of International Application No. PCT/CN2021/110981 filed on Aug. 5, 2021, which claims priority to Chinese Patent Application No. 202110103853.8 filed on Jan. 26, 2021. The disclosures of these applications are hereby incorporated by reference in their entirety.

BACKGROUND

A large number of tests need to be performed on a semiconductor structure to eliminate unqualified products. During a process of testing the semiconductor structure, the semiconductor structure needs to be put into a socket, and taken out from the socket after the test is completed.

SUMMARY

The embodiments of the present disclosure relate to the technical field of semiconductors, and provide a mechanical arm and a mechanical arm assembly, a test system and method, a storage medium and an electronic device.

According to a first aspect of the embodiments of the present disclosure, provided is a mechanical arm for testing a semiconductor structure, including: a body and an operating arm. The operating arm includes a connector, a first adapting part and a second adapting part. The connector is connected to the body. The first adapting part is connected to the connector, and the first adapting part is configured to mount a first operating mechanism for opening and closing a socket. The second adapting part is connected to the connector, and the second adapting part is configured to mount a second operating mechanism for grabbing and releasing the semiconductor device. After the first adapting part drives the first operating mechanism to open the socket, the second adapting part is able to drive the second operating mechanism to put the semiconductor device into the socket or take the semiconductor device out from the socket.

According to a second aspect of the embodiments of the present disclosure, a mechanical arm assembly is provided, which includes a mechanical arm, a first operating mechanism and a second operating mechanism. The mechanical arm includes a connector, a first adapting part and a second adapting part. The connector is connected to the body. The first adapting part is connected to the connector, and the first adapting part is configured to mount a first operating mechanism for opening and closing a socket. The second adapting part is connected to the connector, and the second adapting part is configured to mount a second operating mechanism for grabbing and releasing the semiconductor device. After the first adapting part drives the first operating mechanism to open the socket, the second adapting part is able to drive the second operating mechanism to put the semiconductor device into the socket or take the semiconductor device out from the socket.

According to a third aspect of the embodiments of the present disclosure, a test system for a semiconductor structure is provided, which includes a mechanical arm assembly and a socket. The mechanical arm assembly includes a mechanical arm, a first operating mechanism and a second operating mechanism. The mechanical arm includes a connector, a first adapting part and a second adapting part. The connector is connected to the body. The first adapting part is connected to the connector, and the first adapting part is configured to mount a first operating mechanism for opening and closing a socket. The second adapting part is connected to the connector, and the second adapting part is configured to mount a second operating mechanism for grabbing and releasing the semiconductor device. After the first adapting part drives the first operating mechanism to open the socket, the second adapting part is able to drive the second operating mechanism to put the semiconductor device into the socket or take the semiconductor device out from the socket.

According to a fourth aspect of the embodiments of the present disclosure, a test method for a semiconductor structure is provided, which includes the following operations. A connector of a mechanical arm is controlled to move, so that a first adapting part connected to the connector is moved, and a first operating mechanism connected to the first adapting part opens a socket. The connector is controlled to move, so that a second adapting part connected to the connector is moved, and a second operating mechanism connected to the second adapting part puts the semiconductor device into the socket. The connector is controlled to move, so that the first adapting part drives the first operating mechanism to move, and the first operating mechanism closes the socket. A test platform is controlled to run.

According to a fifth aspect of the embodiments of the present disclosure, a computer-readable storage medium is provided, which has a computer program stored thereon. When the program is executed by a processor, a test method for a semiconductor structure is implemented. The test method includes the following operations. A connector of a mechanical arm is controlled to move, so that a first adapting part connected to the connector is moved, and a first operating mechanism connected to the first adapting part opens a socket. The connector is controlled to move, so that a second adapting part connected to the connector is moved, and a second operating mechanism connected to the second adapting part puts the semiconductor device into the socket. The connector is controlled to move, so that the first adapting part drives the first operating mechanism to move, and the first operating mechanism closes the socket. A test platform is controlled to run.

According to a sixth aspect of the embodiments of the present disclosure, an electronic device is provided, which includes a processor and a memory. The memory is configured to store an executable instruction of the processor. The processor is configured to perform the test method for a semiconductor structure by executing the executable instruction. The test method includes the following operations. A connector of a mechanical arm is controlled to move, so that a first adapting part connected to the connector is moved, and a first operating mechanism connected to the first adapting part opens a socket. The connector is controlled to move, so that a second adapting part connected to the connector is moved, and a second operating mechanism connected to the second adapting part puts the semiconductor device into the socket. The connector is controlled to move, so that the first adapting part drives the first operating mechanism to move, and the first operating mechanism closes the socket. A test platform is controlled to run.

BRIEF DESCRIPTION OF THE DRAWINGS

Various objects, features and advantages of the embodiments of the present disclosure will become more apparent from the detailed description of the embodiments of the present disclosure made in combination with the accompanying drawings. The drawings are merely exemplary illustrations of the present disclosure and are not necessarily drawn to scale. In the drawings, like reference numerals refer to the same or similar components throughout.

Figure 1:
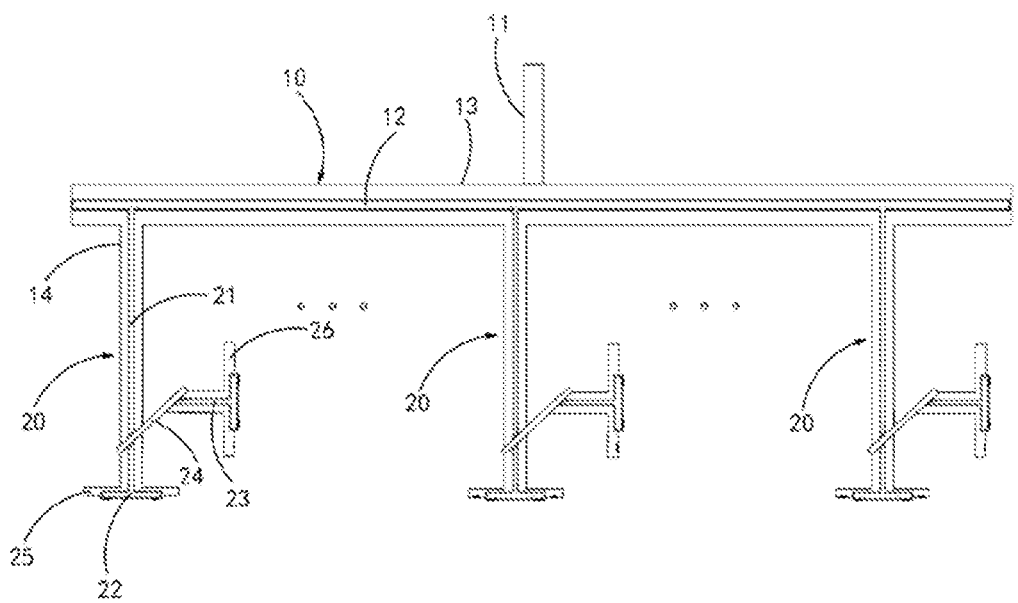
FIG. 1 is a structure diagram of a mechanical arm shown according to an exemplary implementation.

Reference numerals are illustrated as follows:
1: socket; 2: first operating mechanism; 3: second operating mechanism; 4: test platform; 5: indicator light; 6: image collection component; 7: server;
10: body; 11: supporting member; 12: moving member; 13: first housing member; 14: second housing member; 20: operating arm; 21: connector; 22: first adapting part; 23: second adapting part; 24: rotating member; 25: third housing member; 26: fourth housing member;
300: program product; 600: electronic device; 610: processing unit; 620: storage unit; 6201: RAM; 6202, cache storage unit; 6203: ROM; 6204; program/utility; 6205: program module; 630: bus; 640: display unit; 650: I/O interface; 660: network adapter; 700: peripherals.

DETAILED DESCRIPTION

Typical embodiments that embody the features and advantages of the present disclosure will be described in detail in the following description. It is to be understood that the present disclosure can be changed in different embodiments without departing from the scope of the present disclosure, and that the description and drawings are illustrative in nature and are not intended to limit the present disclosure.

In the following description of different exemplary implementations of the present disclosure, reference is made to the drawings, which form a part of the present disclosure, and in which different exemplary structures, systems and steps for implementing various aspects of the present disclosure are shown by way of an example. It is to be understood that other specific schemes of a component, a structure, an exemplary apparatus, a system and a step may be used, and structural and functional modifications may be made without departing from the scope of the present disclosure. Moreover, although terms "above", "between", "within", and the like may be used in the specification to describe different exemplary features and elements of the present disclosure, these terms are used herein for convenience only, for example, according to a direction of an example in the drawings. Any content in the specification should not be construed as requiring a specific three-dimensional direction of a structure to fall within the scope of the present disclosure.

In some implementations, by means of manual intervention, the efficiency is low and the labor costs are relatively high.

An embodiment of the present disclosure provides a mechanical arm for testing a semiconductor structure. Referring to FIG. 1 to FIG. 4, the mechanical arm includes a body 10 and an operating arm 20. The operating arm 20 includes: a connector 21, the connector 21 being connected to the body 10; a first adapting part 22, the first adapting part 22 being connected to the connector 21, and the first adapting part 22 being configured to mount a first operating mechanism 2 for opening and closing a socket 1; and a second adapting part 23, the second adapting part 23 being connected to the connector 21, and the second adapting part 23 being configured to mount a second operating mechanism 3 for grabbing and releasing the semiconductor device. After the first adapting part 22 drives the first operating mechanism 2 to open the socket 1, the second adapting part 23 is able to drive the second operating mechanism 3 to put the semiconductor device into the socket 1 or take the semiconductor device out from the socket 1.

According to the mechanical arm of an embodiment of the present disclosure, the first operating mechanism 2 and the second operating mechanism 3 can be mounted on the connector 21 through the first adapting part 22 and the second adapting part 23 respectively. The first operating mechanism 2 can open and close the socket 1, and the second operating mechanism 3 can grab and release the semiconductor device. The socket 1 is opened through the first operating mechanism 2, the semiconductor device grabbed by the second operating mechanism is put into the socket 1 by the second operating mechanism 3, the socket 1 is closed through the first operating mechanism 2; after the semiconductor device is tested, the socket 1 is opened through the first operating mechanism 2, and the semiconductor device is taken out from the socket 1 by the second operating mechanism 3, so that one test of the semiconductor device is completed. In the entire test process, the mechanical arm realizes automatic grabbing and release of the semiconductor device, as well as automatic opening and closure of the socket 1, so that the test efficiency is improved.

It is to be noted that the socket 1 may be a socket of different types, that is, the first operating mechanism 2 for opening and closing the socket 1 may also be adapted to the socket. In some embodiments, it is not excluded that the first operating mechanism 2 may be compatible with a plurality of sockets at the same time, which is not limited here.

The first operating mechanism 2 may be a clamping jaw mechanism, that is, a connection to the socket 1 is achieved by opening and closing a clamping jaw, thereby opening and closing the socket 1. In an embodiment, the first operating mechanism 2 may also be a suction mechanism, that is, the socket 1 is opened and closed by sucking the socket 1. The specific structure of the first operating mechanism 2 is not limited here and may be adaptively adjusted according to practical requirements.

Correspondingly, the second operating mechanism 3 may be a clamping jaw mechanism, that is, the semiconductor device is grabbed by opening and closing of a clamping jaw. In an embodiment, the second operating mechanism 3 may also be a suction mechanism, for example, a suction pen clamp. The specific structure of the second operating mechanism 3 is not limited here and may be adaptively adjusted according to practical requirements.

In an embodiment, as shown in FIG. 1, the body 10 includes: a supporting member 11, the supporting member 11 being configured to suspend the mechanical arm in the air; and a moving member 12, the moving member 12 being arranged on the supporting member 11 and being movably arranged relative to the supporting member 11. The connector 21 is connected to the moving member 12, and the connector 21 can move along with the moving member 12, so that the first operating mechanism 2 or the second operating mechanism 3 completes a corresponding operation.

Specifically, the moving member 12 is connected to the connector 21, so that when the position of the moving member 12 changes, the connector 21 will drive the first adapting part 22 and the second adapting part 23 to move, thus the first operating mechanism 2 and the second operating mechanism 3 complete corresponding operations.

It is to be noted that the positional relationship of the first operating mechanism 2 and the second operating mechanism 3 with respect to the socket 1 may be adjusted, so that the first operating mechanism 2 and the second operating mechanism 3 respectively complete the corresponding operations.

In an embodiment, the moving member 12 is movably arranged in the vertical direction relative to the supporting member 11, so as to drive the connector 21 to move in a direction close to or away from the socket 1. That is, when the first operating mechanism 2 needs to open the socket 1, the moving member 12 needs to be moved downward, the first operating mechanism 2 is close to the socket 1 at this time, and after the first operating mechanism 2 is connected to the socket 1, the moving member 12 is moved upward, and the first operating mechanism 2 is far away from the socket 1 at this time, thereby opening the socket 1. When the second operating mechanism 3 needs to grab a semiconductor device at a certain station, the moving member 12 needs to be moved downwards, and the second operating mechanism 3 is close to the semiconductor device at this time. After the semiconductor device is grabbed by the second operating mechanism 3, the moving member 12 is moved upwards and after the second operating mechanism 3 is opposite to the opened socket 1, the moving member 12 is moved downwards, and the second operating mechanism 3 is close to the socket 1 at this time. After the second operating mechanism 3 is moved into position, the semiconductor device may be put into the socket 1, and the first operating mechanism 2 is moved to close the socket 1 at this time. The socket 1 is repeatedly opened after the test is completed, the semiconductor device is taken out by the second operating mechanism 3, and the test is cycled for the next semiconductor device.

In an embodiment, the moving member 12 is rotatably arranged relative to the supporting member 11, so that the connector 21 can rotate along with the moving member 12.

Specifically, during the rotation of the moving member 12, the first operating mechanism 2 or the second operating mechanism 3 may be arranged opposite to the socket 1, so that the first operating mechanism 2 or the second operating mechanism 3 completes a corresponding action.

In an embodiment, during the rotation of the moving member 12, the first operating mechanism 2 and the second operating mechanism 3 may be moved to another station position, that is, arranged opposite to another socket 1, thereby completing a test of the semiconductor device at another position.

In some embodiments, there are a plurality of operating arms 20. The plurality of operating arms 20 are successively arranged on the body 10, that is, when the moving member 12 rotates, corresponding position adjustment may be performed on the plurality of operating arms 20, so that the operating arms correspond to other sockets 1.

In some embodiments, a plurality of operating arms 20 are arranged along the circumferential direction of the body 10, that is, the plurality of operating arms 20 may respectively correspond to a plurality of sockets 1. During the rotation of the moving member 12, the plurality of operating arms 20 may respectively correspond to the next socket 1, so as to perform the next test. By means of the operation, it is ensured that the plurality of operating arms 20 is simultaneously in a running process, and dry running at a certain position may be avoided.

In an embodiment, the moving member 12 may be movably arranged in the horizontal direction relative to the supporting member 11, that is, the moving member 12 may drive the connector 21 to move left and right, thereby performing position adjustment or moving to the next socket 1.

In some embodiments, a plurality of operating arms 20 may be arranged on the body 10 at intervals in the linear direction.

It is to be noted that, as the moving member 12 is movably arranged in the vertical direction relative to the supporting member 11, an air cylinder or an oil cylinder may be arranged on the supporting member 11, and a piston rod is connected to the moving member 12, so that up-down movement of the moving member 12 is achieved by extension and retraction of the piston rod. In some embodiments, the up-down movement of the moving member 12 may also be achieved by driving a gear and a rack through a motor, or the up-down movement of the moving member 12 may be achieved by driving a lead screw assembly through a motor, which is not limited here.

As the moving member 12 is rotatably arranged relative to the supporting member 11, a motor may be arranged on the supporting member 11, and the moving member 12 is rotated by the motor, which is not limited here.

The moving member 12 may be movably arranged in the horizontal direction relative to the supporting member 11, and reference may be made to a driving manner in which the moving member 12 is moved in the vertical direction relative to the supporting member 11, which will not be described in detail here.

It is to be noted that reference may be made to the above manner for both rotational and linear movement drive manners, and that only certain implementations are given here. During the moving process, structures (for example, a guide rail and the like) may be combined to ensure the moving stability.

In an embodiment, as shown in FIG. 1, the body 10 further includes: a first housing member 13, the first housing member 13 being connected to the supporting member 11, and the moving member 12 being movably arranged in the first housing member 13, so that the moving member 12 is arranged on the supporting member 11 through the first housing member 13. The first housing member 13 is a protective structure of the body 10, and an accommodating space is formed inside the first housing member 13, so as to realize the protection to the moving member 12.

In an embodiment, the body 10 further includes: a second housing member 14, the second housing member 14 being connected to the first housing member 13. The connector 21 is movably arranged in the second housing member 14, and the first adapting part 22 and the second adapting part 23 can move along with the connector 21, that is, the second housing member 14 realizes the protection to the connector 21.

In some embodiments, the first housing member 13 and the second housing member 14 may be of an integrated structure. The first housing member 13 and the second housing member 14 form an integrated housing member. When the connector 21 can perform a wide range of linear or rotational movement relative to the second housing member 14, the second housing member 14 can protect the connector 21 without affecting the rotation of the connector 21. For example, when the plurality of operating arms 20 is arranged along the circumferential direction of the body 10, the second housing member 14 may be an annular member.

In some embodiments, there may be a plurality of second housing members 14, that is, each second housing member 14 corresponds to a separate connector 21.

In an embodiment, the connector 21 is movably arranged relative to the moving member 12, that is, position adjustment may be performed on the connector 21 itself to adapt its positional relationship with the socket 1.

In an embodiment, the connector 21 may move in the horizontal direction relative to the moving member 12.

In some embodiments, the first housing member 13 is movably arranged relative to the supporting member 11, that is, the first housing member 13 may drive the connector 21 to move relative to the moving member 12, so that the connector 21 is moved to a position of a different socket 1.

In an embodiment, the supporting member 11 can drive the mechanical arm to move in the air, that is, the supporting member 11 may be similar to a crown block, so that the entire mechanical arm is moved.

In an embodiment, the supporting member 11 can realize at least one of rotation or linear movement.

Figure 2:
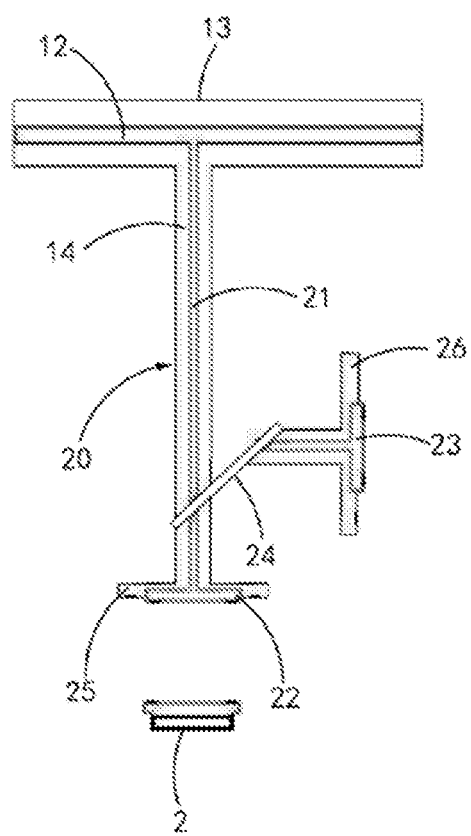
FIG. 2 is a structure diagram of a mechanical arm in one state shown according to an exemplary implementation.
Figure 3:
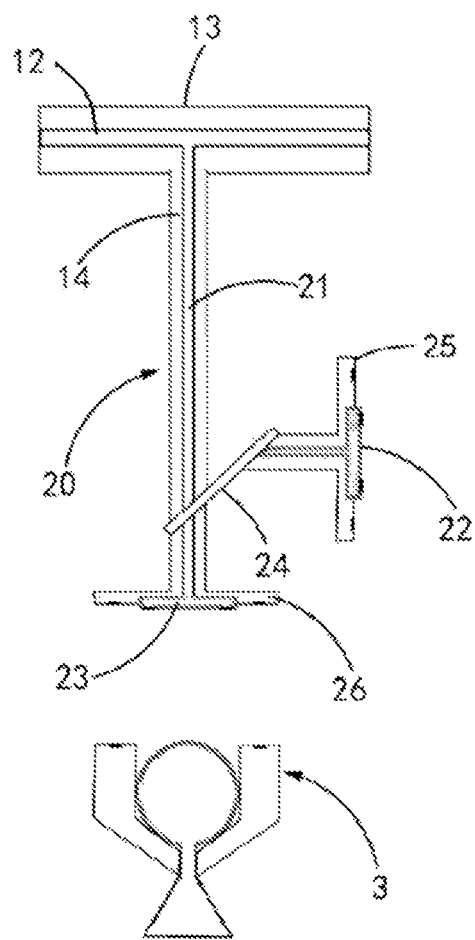
FIG. 3 is a structure diagram of a mechanical arm in another state shown according to an exemplary implementation.

In an embodiment, as shown in FIG. 1 to FIG. 3, the operating arm 20 further includes: a rotating member 24, the rotating member 24 being connected to the connector 21. Both of the first adapting part 22 and the second adapting part 23 are arranged on the rotating member 24, so that both of the first adapting part 22 and the second adapting part 23 are connected to the connector 21 through the rotating member 24. The arrangement of the rotating member 24 makes it easier to adjust the positions of the first adapting part 22 and the second adapting part 23 to adapt the positional relationship with the socket 1.

It is to be noted that the rotating member 24 may be directly connected to the connector 21. The rotating member 24 may also be indirectly connected to the connector 21.

In an embodiment, at least part of the rotating member 24 is rotatably arranged relative to the connector 21, so that both of the first adapting part 22 and the second adapting part 23 are rotatably arranged along with the rotating member 24. The rotating member 24 is configured to arrange one of the first operating mechanism 2 or the second operating mechanism 3 opposite to the socket 1.

Specifically, as shown in combination with FIG. 2 and FIG. 3, the first adapting part 22 is connected to the first operating mechanism 2, and the second adapting part 23 is connected to the second operating mechanism 3, and mounting planes of the first adapting part 22 and the second adapting part 23 are located in the same horizontal plane. That is, the rotating member 24 may be understood as an annular structure. At this time, the rotation of the rotating member 24 enables the first adapting part 22 and the second adapting part 23 to respectively correspond to the socket 1. The center point of rotation of the similar rotating member 24 is located above the socket 1, and the first adapting part 22 and the second adapting part 23 are respectively connected in the circumferential direction of the center point, so that when the rotating member 24 rotates, the first adapting part 22 and the second adapting part 23 may be respectively directly located right above the socket 1, thereby performing corresponding operations.

It is to be noted that the rotating member 24 may include a fixed part and a rotating part. The fixed part is connected to the connector 21, the rotating part is located on the fixed part, and the first adapting part 22 and the second adapting part 23 are connected to the rotating part, so that when the rotating part is rotated relative to the fixed part, the first adapting part 22 and the second adapting part 23 are positionally adjusted.

In an embodiment, as shown in FIG. 2 and FIG. 3, the operating arm 20 further includes: a third housing member 25, the third housing member 25 being connected to the rotating member 24. The first adapting part 22 is located in the third housing member 25, and the third housing member 25 realizes the protection to the first adapting part 22.

In an embodiment, as shown in FIG. 2 and FIG. 3, the operating arm 20 further includes: a fourth housing member 26, the fourth housing member 26 being connected to the rotating member 24. The second adapting part 23 is located in the fourth housing member 26, and the fourth housing member 26 realizes the protection to the second adapting part 23.

An embodiment of the present disclosure further provides a mechanical arm assembly. Referring to FIG. 1 to FIG. 4, the mechanical arm assembly includes the above mechanical arm, a first operating mechanism 2 and a second operating mechanism 3.

According to the mechanical arm assembly provided by an embodiment of the present disclosure, a socket 1 can be opened and closed through the first operating mechanism 2, a semiconductor device can be grabbed and released through the second operating mechanism 3. In the entire test process, the mechanical arm assembly realizes automatic grabbing and release of the semiconductor device, as well as automatic opening and closure of the socket 1, so that the test efficiency is improved.

In an embodiment, the first operating mechanism 2 is detachably arranged on the first adapting part 22 of the mechanical arm, that is, the first operating mechanism 2 may be replaced at any time.

In some embodiments, the first operating mechanism 2 is clamped, bonded or connected through a fastener to the first adapting part 22.

In an embodiment, the first operating mechanism 2 is undetachably arranged on the first adapting part 22 of the mechanical arm. For example, the first operating mechanism 2 may be directly welded to the first adapting part 22.

In an embodiment, the second operating mechanism 3 is detachably arranged on the second adapting part 23 of the mechanical arm, that is, the second operating mechanism 3 may be replaced at any time.

In some embodiments, the second operating mechanism 3 is clamped, bonded or connected through a fastener to the second adapting part 23.

In an embodiment, the second operating mechanism 3 is undetachably arranged on the second adapting part 23 of the mechanical arm. For example, the second operating mechanism 3 is welded to the second adapting part 23.

Figure 4:
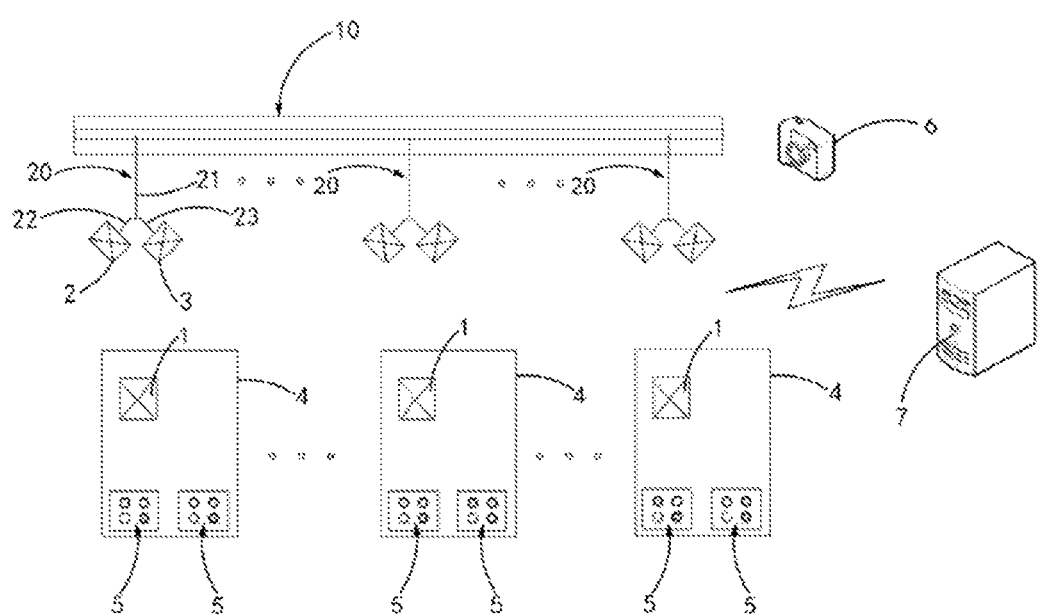
FIG. 4 is a structure diagram of a test system for a semiconductor structure shown according to an exemplary implementation.

An embodiment of the present disclosure further provides a test system for a semiconductor structure. Referring to FIG. 4, the system includes the above mechanical arm assembly and a socket 1.

According to the test system for a semiconductor structure of an embodiment of the present disclosure, because of the arrangement of the mechanical arm assembly, during the entire test process, the semiconductor device is automatically grabbed and released by the mechanical arm assembly, and the socket 1 is automatically opened and closed, so that an automatic test is completed, thus the test efficiency is improved.

In an embodiment, as shown in FIG. 4, the test system for a semiconductor structure further includes that: a test platform 4. The socket 1 is arranged on the test platform 4, and the mechanical arm assembly is located above the test platform 4. The test platform 4 may be configured to run a test program to test a semiconductor device.

Specifically, when being applied to a high and low temperature test, a small warm box (for example, a heating cover) is mounted on the test platform 4, or all devices or all test platforms are located in the same large warm box, and tests are realized by running the test program through the test platforms. The test platform 4 is not limited here, and a test platform commonly used in the related art may be used to test the semiconductor device.

In an embodiment, as shown in FIG. 4, the test system for a semiconductor structure further includes: an indicator light 5, the indicator light 5 being arranged on the test platform 4, and the indicator light 5 may indicate different results through different display manners.

Specifically, the indicator light 5 may correspond to different test results or record information by displaying different colors. In an embodiment, a plurality of indicator lights 5 may be arranged, as shown in FIG. 4. The plurality of indicator lights 5 may be divided into a plurality of groups, and each group of indicator lights 5 display the different test results or recording information.

In the embodiment, the indicator light 5 may represent:
1. Socket closed and filled with no grain (semiconductor device);
2. Socket opened and filled with no grain;
3. Socket opened and filled with grain;
4. Socket closed and filled with grain;
5. Turn-on, the mechanical arm turned on, the test platform 4, the server 7 turned on, etc.;
6. Testing;
7. Test failed with multiple possible states, including failure in connection to the server 7, downtime of test system, etc.;
8. Test finished, and the test failed;
9. Test finished, and test passed;
10. First test, second test and the like of the test platform 4, a group of indicator lights 5 specially arranged for displaying the number of tests.

In an embodiment, as shown in FIG. 4, the test system for a semiconductor structure further includes: an image collection part 6. A collection head of the image collection part 6 may be arranged opposite to at least one of the indicator light 5 or the socket 1. The image collection part 6 may be configured to read a state indicated by the indicator light 5 and also to scan information of the semiconductor device and the corresponding test platform 4. The image collection part 6 may be a camera.

In an embodiment, as shown in FIG. 4, the test system for a semiconductor structure further includes: a server 7. The server 7 is in signal connection with the test platform 4, and the server 7 is in signal connection with the mechanical arm.

The server 7 is configured to: input a test policy (for example, replacing/configuring a test program, setting the number of retest times, and the like), acquire test information (for example, a test log, a test case result, error information, and the like) from the test platform 4, command the test platform to switch on/off or configure all the warm boxes according to the configuration, acquire a test state, as well as information of the semiconductor device and test platform from the image collection part 6, command the mechanical arm to act, for example, open the socket, replace with a new semiconductor device to be tested, move the connector 21 (for example, retesting on another test platform, so that the semiconductor device which has been tested may be retested on another test platform)), close the socket, and the like.

Figure 5:
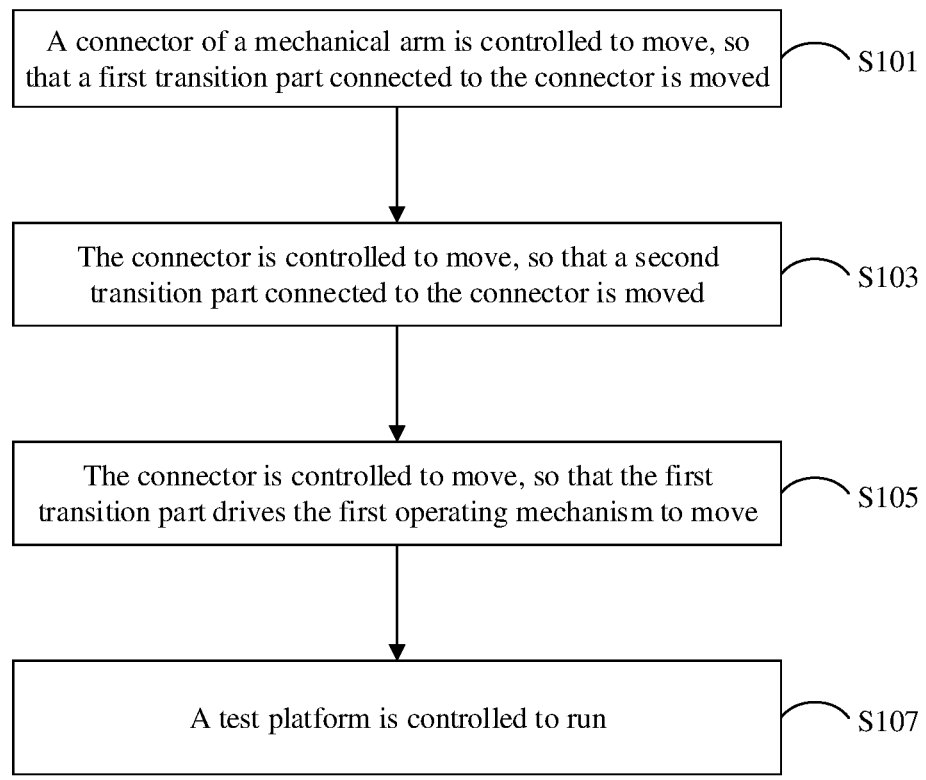
FIG. 5 is a flowchart of a test method for a semiconductor structure shown according to an exemplary implementation.

An embodiment of the present disclosure further provides a test method for a semiconductor structure. Referring to FIG. 5, the test method for a semiconductor structure includes the following operations.

At S101, a connector 21 of a mechanical arm is controlled to move, so that a first adapting part 22 connected to the connector 21 is moved, and a first operating mechanism 2 connected to the first adapting part 22 opens a socket 1.

At S103, the connector 21 is controlled to move, so that a second adapting part 23 connected to the connector 21 is moved, and a second operating mechanism 3 connected to the second adapting part 23 puts the semiconductor device into the socket 1.

At S105, the connector 21 is controlled to move, so that the first adapting part 22 drives the first operating mechanism 2 to move, and the socket 1 is closed by the first operating mechanism 2.

At S107, a test platform 4 is controlled to run.

According to the test method for a semiconductor structure of an embodiment of the present disclosure, the mechanical arm is controlled to drive the first operating mechanism 2 and the second operating mechanism 3 to move, so that the semiconductor device is automatically grabbed and released, the socket 1 is automatically opened and closed, and the test efficiency of the test platform 4 is improved.

In an embodiment, the test method for a semiconductor structure further includes: a rotating member 24 connected to the connector 21 is controlled to rotate, so that the first adapting part 22 and the second adapting part 23 connected to the rotating member 24 are rotated, and one of the first operating mechanism 2 or the second operating mechanism 3 is arranged opposite to the socket 1, so that the first operating mechanism 2 and the second operating mechanism 3 perform corresponding operations respectively.

In an embodiment, the test method for a semiconductor structure further includes: a body 10 of the mechanical arm is controlled to move, so that various connectors 21 on the body 10 move along with the body, so that the semiconductor device which has been tested may be retested on another test platform.

In an embodiment, the above test system for a semiconductor structure is applied to the test method for a semiconductor structure. Two groups of indicator lights are arranged on the test platform and may be configured to indicate the test state of the device. The test system and software are executed automatically, and the states of the two groups of indicator lights on the test platform are controlled according to the progress and result of the test program. The tested semiconductor device is automatically replaced by the mechanical arm according to the state of the indicator light and the test policy. The mechanical arm acquires a test result according to the state of the indicator light, and stores the test result. A test result collection and storage server acquires and stores test information (for example, a log) and the test result from the test platform and the mechanical arm.

The embodiments of the present disclosure further provide a computer-readable storage medium having a computer program stored thereon. When the program is executed by a processor, the above test method for a semiconductor structure is implemented.

In some possible implementations, various aspects of the embodiments of the present disclosure may also be implemented in the form of a program product, including a program code. When the program product is run on a terminal device, the program code is configured to enable the terminal device to execute the steps according to various exemplary embodiments of the present disclosure described in the above "the above test method for a semiconductor structure" section of the specification.

Figure 6:
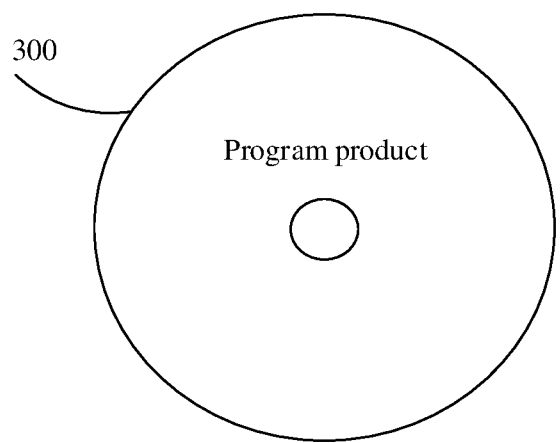
FIG. 6 schematically shows a schematic diagram of a computer-readable storage medium in the exemplary embodiments of the present disclosure.

Referring to FIG. 6, a program product 300 used for implementing the above method according to the implementations of the present disclosure is described. The program product 300 may employ a portable Compact Disc Read Only Memory (CD-ROM) and include a program code, and may be run on a terminal device, for example, a personal computer. However, the program product of the embodiments of the present disclosure is not limited here, and in the document, the readable storage medium may be any tangible medium that contains or stores a program. The program may be used by or in combination with an instruction execution system, apparatus, or device.

The program product may employ any combination of one or more readable media. The readable medium may be a readable signal medium or a readable storage medium. For example, the readable storage medium may be, but is not limited to, an electrical, magnetic, optical, electromagnetic, infrared, or semiconductor system, apparatus, or device, or any combination thereof. More specific examples (a non-exhaustive list) of the readable storage medium include: an electrical connection having one or more wires, a portable disk, a hard disk, a Random Access Memory (RAM), a Read Only Memory (ROM), an Erasable Programmable Read Only Memory (EPROM or Flash memory), an optical fiber, a portable Compact Disk Read Only Memory (CD-ROM), an optical storage device, a magnetic storage device, or any suitable combination thereof.

The computer-readable storage medium may include a data signal propagating in a baseband or as part of a carrier. The data signal carries a readable program code. Such propagated data signal may be in various forms, including but not limited to an electromagnetic signal, an optical signal, or any suitable combination thereof. The readable storage medium may also be any readable medium in addition to the readable storage medium. The readable medium may send, propagate, or transmit a program used by or in combination with an instruction execution system, apparatus, or device. The program code contained on the readable storage medium may be transmitted through any suitable medium including, but not limited to, wireless, wired, fiber optic, RF, and the like, or any suitable combination thereof.

The program code for executing an operation of the embodiments of the present disclosure may be written in any combination of one or more programming languages. The programming language includes an object-oriented programming language (for example, Java, C++, and the like), as well as a conventional procedural programming language, for example, a "C" language or a similar programming language. The program code may be executed entirely on a user computing device, partially on a user device, as a stand-alone software package, partially on a user computing device, partially on a remote computing device, or entirely on a remote computing device or server. In the case of the remote computing device, the remote computing device may be connected to the user computing device through any kind of network, including a Local Area Network (LAN) or a Wide Area Network (WAN), or may be connected to the external computing device (for example, connected through the Internet using an Internet service provider).

The embodiments of the present disclosure further provide an electronic device, including a processor; and a memory, configured to store an executable instruction of the processor. The processor is configured to perform the test method for a semiconductor structure by executing the executable instruction.

Those skilled in the art will appreciate that various aspects of the embodiments of the present disclosure may be implemented as a system, method, or program product. Therefore, various aspects of the embodiments of the present disclosure may be embodied in the form of: an entire hardware implementation, an entire software implementation (including firmware, microcode, and the like), or an implementation combining hardware and software aspects, which may be collectively called as a "circuit", "module", or "system" here.

Hereinafter, the electronic device 600 of the implementation of the present disclosure will be described with reference to FIG. 7. The electronic device 600 shown in FIG. 7 is merely an example and any limitation should not be imposed on a function and use scope of the embodiments of the present disclosure.

Figure 7:
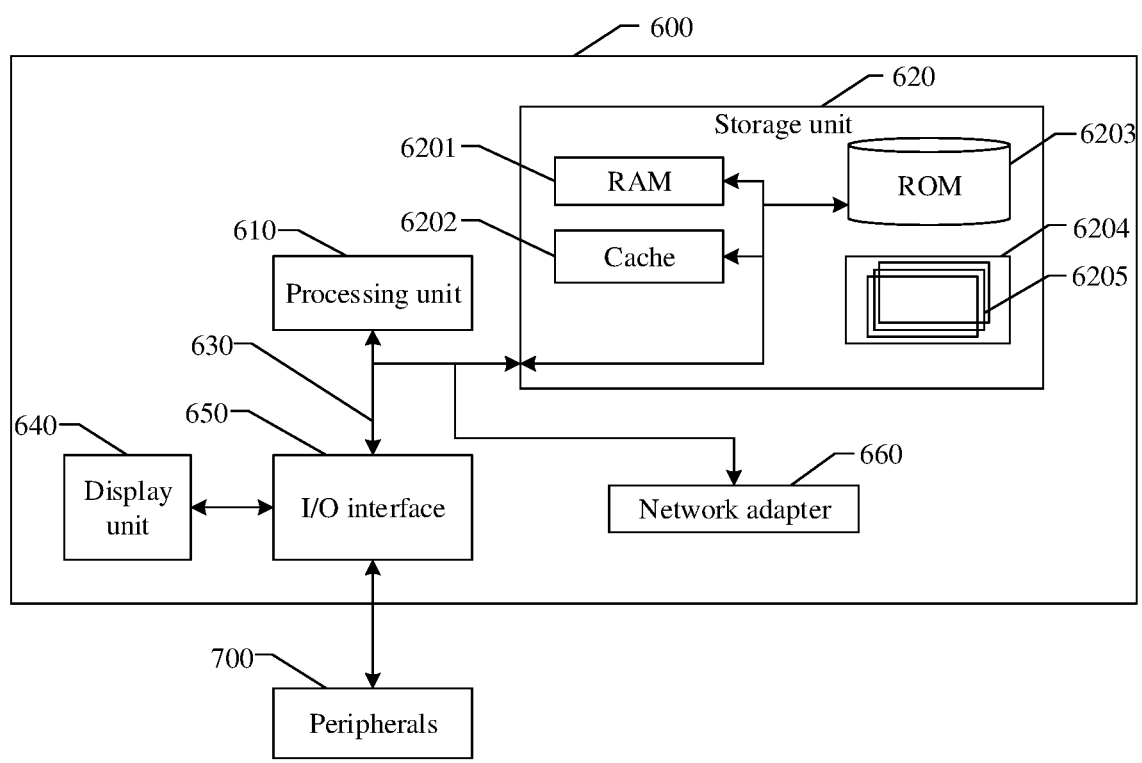
FIG. 7 schematically shows a schematic diagram of an electronic device in the exemplary embodiments of the present disclosure.

As shown in FIG. 7, the electronic device 600 is presented in the form of a general purpose computing device. Assemblies of the electronic device 600 may include, but are not limited to, at least one processing unit 610, at least one storage unit 620, a bus 630 connecting different system assemblies (including the storage unit 620 and the processing unit 610), and a display unit 640.

The storage unit stores a program code. The program code may be executed by the processing unit 610, so that the processing unit 610 executes the steps according to various exemplary implementations of the present disclosure described in the above "the above test method for a semiconductor structure" section of the specification.

The storage unit 620 may include a readable medium in the form of a volatile storage unit, for example, a Random Access Memory (RAM) 6201 and/or a cache storage unit 6202, and may further include a Read Only Memory (ROM) 6203.

The storage unit 620 may further include a program/utility 6204 having a set (at least one) of program modules 6205. Such program module 6205 includes, but is not limited to, an operating system, one or more applications, other program modules, and program data. Each or a certain combination of these examples may include the implementation of a network environment.

The bus 630 may be expressed as one or more of several types of bus structures, including a storage unit bus or a storage unit controller, a peripheral bus, an accelerated graphics port, a processing unit, or a local bus using any bus structure in a plurality of bus structures.

The electronic device 600 may also communicate with one or more peripherals 700 (for example, a keyboard, a pointing device, a Bluetooth device, and the like), may also communicate with one or more devices that enable a user to interact with the electronic device 600, and/or may communicate with any device (for example, a router, a modem, and the like) that enables the electronic device 600 to communicate with one or more other computing devices. Such communication may be performed through an input/output (I/O) interface 650. Also, the electronic device 600 may also communicate with one or more networks (for example, a Local Area Network (LAN), a Wide Area Network (WAN), and/or a public network, for example, the Internet) through a network adapter 660. The network adapter 660 communicates with other modules of the electronic device 600 through the bus 630. It is to be understood that although not shown in the drawings, the electronic device 600 may be used with other hardware and/or software modules, including but not limited to: a microcode, a device driver, a redundant processing unit, an external disk drive array, a RAID system, a tape driver, and a data backup storage system.

From the above description of the implementations, those skilled in the art are easy to understand that the exemplary implementations described here may be implemented through software or may also be implemented through the software in combination with necessary hardware. Therefore, the implementations of the present disclosure may be embodied in the form of a software product. The software product may be stored in a non-volatile storage medium (which may be a CD-ROM, a U-disk, a mobile hard disk, and the like) or on a network, and may include a number of instructions, so that a computing device (which may be a personal computer, a server or a network device, and the like) executes the above test method for a semiconductor structure according to the implementations of the present disclosure.

Other implementations of the present disclosure will be apparent to those skilled in the art from consideration of the specification and practice of the present disclosure disclosed here. The present disclosure is intended to cover any variations, uses, or adaptations of the present disclosure, and the variations, uses, or adaptations follow the general principles of the present disclosure and include common general knowledge or conventional technical means in the art undisclosed by the present disclosure. The specification and examples are considered as exemplary only, and a true scope and spirit of the present disclosure are indicated by the foregoing claims.

What is claimed is:

1. A test system for a semiconductor structure, comprising:
    a test platform being configured to run a test program to test a semiconductor structure to be tested;
    a socket being arranged on the test platform and being configured to provide a test site for the semiconductor structure to be tested;
    an indicator light being arranged on the test platform and being configured to indicate different results through different display manners;
    an image collection part being configured to read a state indicated by the indicator light and also to scan information of the semiconductor structure to be tested on the corresponding test platform,
    a mechanical arm assembly being located above the test platform and the mechanical arm assembly comprising a mechanical arm, a first operating mechanism and a second operating mechanism; and
    a server being in signal connection with the test platform and in signal connection with the mechanical arm;
    wherein mechanical arm comprises:
    a body and an operating arm, the operating arm comprising:
    a connector, the connector being connected to the body;
    a first adapting part, the first adapting part being connected to the connector, and the first adapting part being configured to mount a first operating mechanism for opening and closing the socket; and
    a second adapting part, the second adapting part being connected to the connector, and the second adapting part being configured to mount a second operating mechanism for grabbing and releasing the semiconductor structure to be tested,
    a rotating member, the rotating member being connected to the connector, and both of the first adapting part and the second adapting part are arranged on the rotating member, so that both of the first adapting part and the second adapting part are connected to the connector through the rotating member;
    wherein after the first adapting part drives the first operating mechanism to open the socket, the second adapting part is able to drive the second operating mechanism to put the semiconductor structure into the socket or take the semiconductor structure out from the socket.

2. A test method for a semiconductor structure, comprising:
    providing a semiconductor structure to be tested, and providing the test system of claim 1,
    controlling the connector of the mechanical arm to move by the server, so that the first adapting part connected to the connector is moved, and the first operating mechanism connected to the first adapting part opens the socket;
    controlling the connector to move by the server, so that the second adapting part connected to the connector is moved, and the second operating mechanism connected to the second adapting part puts the semiconductor structure to be tested into the socket;
    controlling the connector to move by the server, so that the first adapting part drives the first operating mechanism to move, and the first operating mechanism closes the socket; and
    controlling a test platform to run by the server;
    indicating different test results by the indicator light; and
    controlling the image collection part to read the state indicated by the indicator light and scanning information of the semiconductor structure to be tested on the corresponding test platform by the server.

3. A computer-readable storage medium, having a computer program stored thereon, wherein when executed by a processor, the program causes the processor to implement the method of claim 2.

4. An electronic device, comprising:
    a processor; and
    a memory, configured to store an executable instruction of the processor,
    wherein the processor is configured to execute the instruction to implement the method of claim 2.

5. The test system of claim 1, wherein the body comprises:
    a supporting member, the supporting member being configured to suspend the mechanical arm in the air; and
    a moving member, the moving member being arranged on the supporting member and being movably arranged relative to the supporting member, wherein the connector is connected to the moving member, and the connector is able to move along with the moving member.

6. The test system of claim 5, wherein the moving member is movably arranged in the vertical direction relative to the supporting member, so as to drive the connector to move in a direction close to or away from the socket.

7. The test system of claim 6, wherein the moving member is rotatably arranged relative to the supporting member, so that the connector is able to rotate along with the moving member.

8. The test system of claim 5, wherein the body further comprises:
    a first housing member, the first housing member being connected to the supporting member, and the moving member being movably arranged in the first housing member; and
    a second housing member, the second housing member being connected to the first housing member, the connector being movably arranged in the second housing member, and the first adapting part and the second adapting part being able to move along with the connector.

9. The test system of claim 5, wherein the connector is movably arranged relative to the moving member.

10. The test system of claim 5, wherein the supporting member is able to drive the mechanical arm to move in the air.

11. The test system of claim 1, wherein at least part of the rotating member is rotatably arranged relative to the connector, so that both of the first adapting part and the second adapting part are rotatably arranged along with the rotating member, wherein the rotating member is configured to arrange one of the first operating mechanism or the second operating mechanism opposite to the socket.

12. The test system of claim 1, wherein the operating arm further comprises:
    a third housing member, the third housing member being connected to the rotating member, and the first adapting part being arranged in the third housing member.

13. The test system of claim 1, wherein the operating arm further comprises:
    a fourth housing member, the fourth housing member being connected to the rotating member, and the second adapting part being arranged in the fourth housing member.

14. The test system of claim 1, wherein the operating arm of the mechanical arm is a plurality of operating arms, the plurality of operating arms being successively arranged on the body.

15. The test system of claim 14, wherein the plurality of operating arms is arranged along the circumferential direction of the body.

16. The test system of claim 14, wherein the plurality of operating arms is arranged on the body at intervals along the linear direction.

17. The test system of claim 1, wherein the mechanical arm assembly is arranged in at least one of following manners:
    the first operating mechanism is detachably arranged on the first adapting part of the mechanical arm; or
    the second operating mechanism is detachably arranged on the second adapting part of the mechanical arm.

* * * * *